(12) United States Patent
Sasazawa et al.

(10) Patent No.: US 7,273,685 B2
(45) Date of Patent: Sep. 25, 2007

(54) METHOD FOR CONTROLLING SEMICONDUCTOR DEVICE PRODUCTION PROCESS AND A METHOD FOR PRODUCING SEMICONDUCTOR DEVICES

(75) Inventors: Hideaki Sasazawa, Yokohama (JP); Yasuhiro Yoshitake, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/304,778

(22) Filed: Dec. 16, 2005

(65) Prior Publication Data

US 2006/0183040 A1 Aug. 17, 2006

(30) Foreign Application Priority Data

Feb. 16, 2005 (JP) ............................. 2005-038504

(51) Int. Cl.
*G03F 9/00* (2006.01)
*G03C 5/00* (2006.01)

(52) U.S. Cl. ......................................... 430/30; 430/311
(58) Field of Classification Search .................. 430/30, 430/311
See application file for complete search history.

(56) References Cited

U.S. PATENT DOCUMENTS 5,830,612 A * 11/1998 Yamada et al. ............... 430/30
5,906,902 A * 5/1999 Farrow ......................... 430/30

FOREIGN PATENT DOCUMENTS

JP 2001-143982 5/2001

OTHER PUBLICATIONS

J. Sturtevant, et al., "Implementation of a Closed-loop CD and Overlay Controller for sub-0.25 μm Patterning", *SPIE*, vol. 3332, pp. 461-470, 1998.
X. Niu, "Specular Spectroscopic Scatterometry in DUV Lithography", *SPIE*, vol. 3677, pp. 159-168, Mar. 1999.
M. G. Moharam, et al., "Diffraction analysis of dielectric surface-relief gratings", *Journal of Optical Society of America*, vol. 72, No. 10, pp. 1385-1392, Oct. 1982.
"The Proceedings of the 64th Autumn Meeting of the Japan Society of Applied Physics", 1p-R-2, p. 641, 2003.

* cited by examiner

*Primary Examiner*—Christopher G. Young
(74) *Attorney, Agent, or Firm*—Antonelli, Terry, Stout & Kraus, LLP.

(57) ABSTRACT

In order to realize individually and easily optimization of exposure conditions such as exposure dose and focus by photolithography in a production process of semiconductor devices, the present invention is such that: light is radiated onto a pattern on a semiconductor wafer; by an optical system that detects information on a pattern shape using scattered light by its reflection, waveforms of an FEM sample wafer having a plurality of shape deformation patterns prepared in advance are detected and stored; one or more characteristic points on a spectral waveform generated in association with a pattern change is recorded; and a variation model of the characteristic points is obtained. As to a pattern to be measured, a spectral waveform is detected in the same manner as that described above, and deviations (exposure dose deviation and focus deviation) of the formation conditions are estimated from a displacement of the characteristic points on the waveform using the variation model. Thereby, the exposure dose and focus can be independently fed back and the process control can be achieved with high accuracy.

14 Claims, 14 Drawing Sheets

METHOD FOR CONTROLLING SEMICONDUCTOR DEVICE PRODUCTION PROCESS AND A METHOD FOR PRODUCING SEMICONDUCTOR DEVICES

CROSS-REFERENCE TO RELATED APPLICATION

The present application claims priority from Japanese patent application No. JP 2005-038504 filed on Feb. 16, 2005, the content of which is hereby incorporated by reference into this application.

BACKGROUND OF THE INVENTION

Present invention relates to a production technique for semiconductor device and particularly to a technique effectively applied to methods of effecting exposure dose and focus control in an exposure step and further effecting pressure and temperature control in an etching step with high accuracy.

For example, production of semiconductor devices is carried out by repeating on each layer a film formation step of forming a conductive film or insulating film on a silicon wafer and a lithography step of coating on the film a resist that is a photosensitive material, exposing and developing a circuit pattern on a reticle by an exposure system, and then forming the circuit pattern on the wafer by using the remaining resist as a mask to etch the film.

Here, as a background of the present invention, a technique examined as a premise for the present invention by the present inventors will be described with reference to FIGS. 21 to 26. FIG. 21 is a view for explaining an exposure step of a semiconductor; FIG. 22 is a view showing a structure of a scatterometry pattern measuring system of spectroscopic waveform system; FIG. 23 is a view showing a line and space pattern on a wafer; FIG. 24 is a view showing another structure of the scatterometry pattern measuring system of spectroscopic waveform system; FIG. 25 is a view showing a structure of a scatterometry pattern measuring system of angle-scanning type; and FIG. 26 is a view for explaining a shape measurement method by the scatterometry pattern measuring system.

First, in the lithography step, the exposure step in which circuit patterns are printed on a resist is explained using FIG. 21. The circuit patterns to be formed on a layer are drawn in a reticle 200. The reticle includes an area 201 in which a product circuit pattern is drawn and an area 202 in which a test circuit pattern on a periphery thereof is drawn. All the patterns are transferred via an exposure lens 204 onto the resist coated on a wafer 1 by exposure light 203. A transferred and exposed portion of the resist remains in a subsequent development step to serve as a mask (in the case of a negative type resist). In order to confirm whether the transferred circuit patterns have been completed with such exact dimensions as to be designed, a dimensional inspection is commonly conducted using a Scanning Electron Microscope (SEM).

The inspection is conducted, among the transferred circuit patterns 200t, either by directly measuring a transferred product pattern 201t or by measuring transferred test patterns 202t existing outside a chip region. Depending on the measured dimensional size, correction is generally carried out with exposure dose of the exposure system. Automation of this correction of exposure dose is disclosed in, for example, "Implementation of a Closed-loop CD and Overlay Controller for sub 0.25 µm Patterning", SPIE Vol. 3332, 1998. pp 461-470. Meanwhile, except for exposure dose variation of the exposure system, focus deviation is recited as a cause of dimensional variations. A method of correcting not only for exposure dose but also for focus is disclosed in, for example, Japanese Patent Laid-Open Publication No. 2001-143982. This is a method of determining correction amounts for the exposure dose and focus directly from waveforms of SEM by relating a change in the waveforms of SEM to the exposure dose and focus deviations in advance. Further, as to inspection of the circuit patterns on the resist, it has found that not only dimensions but also height-directional shapes of the pattern, that is, a cross-sectional profile affects performance of the semiconductor device. Therefore, a scatterometry, i.e., a method of measuring optically a cross-sectional profile of the transferred circuit pattern is disclosed in, for example, "Specular Spectroscopic Scatterometry in DUV Lithography", SPIE Vol. 3677, 1999, pp 159-168.

Here, a structure of a scatterometry pattern measuring system is explained with reference to FIG. 22. FIG. 22 shows a spectral type scatterometry pattern measuring system.

After light outputted from a white light source 21 is guided to a condenser lens 22 and polarized by a polarizing element 28, the light is radiated, as an incident light 23 with an angle, onto a wafer 100 that is a measurement object on a wafer stage 101. Reflected light 24 from the wafer 100 passes through a polarizing element 28a and is condensed to a grating 26 through a condenser lens 25. The reflected light 24 is spectrally divided by the grating 26, spectrally resolved by a spectroscope 27, and outputted as a spectral waveform 29a by a waveform processing unit 29. Further, the wafer 100 is mounted on a wafer stage 101, and waveform detection is possible at an arbitrary position. The polarizing elements 28 and 29 are capable of changing polarization directions in accordance with directions of the patterns, so that the waveform detection of all of TE polarization parallel to the pattern and TM polarization perpendicular thereto, or that of polarization at an intermediate angle (such as 30 and 45 degrees) can be carried out.

Here, the position to be radiated on the wafer 100 is, for example, a line and space area as shown in FIG. 23. This is because a sufficient quantity of light has to be obtained and uniform patterns are required. Therefore, a shape of being constituted by lines 206L and spaces 206S in FIG. 23 within an area of approximately 50 µm square or larger is required. Such patterns do not commonly exist in the product circuit, so that they are formed in the test pattern area 202t and outside the product circuit patterns.

In addition thereto, a structure of the optical system as shown in FIG. 24 is also known. Incident light 30 outputted from the white light source 21 is reflected by a half mirror 31, condensed by an objective lens 32, and radiated via the polarizing element 28 onto the wafer 100 that is a measurement object. Reflected light 33 from the pattern on the wafer 100 passes through the polarizing element 28 again, passes through the objective lens 32 and the half mirror 31, spectrally divided by the grating 26, and becomes spectral data by the spectroscope 27. Accordingly, a spectral waveform of the objective pattern can be obtained.

In the foregoing, the structure of the spectral type optical system has been shown, and an example of an angle-scanning type optical system is also disclosed. The example is explained with reference to FIG. 25. Light such as laser that is outputted from a single-wavelength light source 40 is radiated, as an incident light 42 with a specified angle of θ from an irradiation end 41, onto the wafer 100 that is a measurement object. Reflected light 43 from the pattern on the wafer 100 is detected by a light receiving element 44. The irradiation end 41 is arranged on an emission-angle changing unit 46 and the light receiving element 44 is arranged on a light-receiving angle changing unit 47, whereby the reflected light with an arbitrary angle can be detected. The light from the light receiving element 44 is transmitted to a detecting unit 45, whereby a reflection strength waveform 45a at a measuring point with respect to each angle is measured.

Next, a means for obtaining a shape of an object using a waveform detected by the above optical system is explained with reference to FIG. 26. An optical waveform obtained from a periodic pattern varies depending on a shape of a measurement pattern. Therefore, the optical waveforms with respect to various cross-sectional profiles are sought in advance by the wave optical simulation and are stored as a library. For example, the cross-sectional profile is modeled in accordance with pitch P, bottom line width W, film thickness H, and taper angle $\phi$ of a repetitive pattern cross-sectional shape 211, whereby the simulation is carried out. A simulation result 212 is stored in a library 213. Comparison of a measured waveform 210 with those stored in the library is carried out by a comparing means 214, and a cross-sectional profile having a waveform matched to the measured waveform is determined as a measurement value. The comparing means 214 uses only the library, carries out the optical simulation in real time without using the library, or takes a combination of both in accordance with required accuracy.

In comparison with the SEM in which there is a possibility that the line width is changed during radiation of electron beams due to a reaction of a photosensitizer, such a scatterometry is advantage in that the measurement is made by the light. Further, the scatterometry is capable of measurement in the atmosphere and it does not take time to carry out vacuuming unlike the SEM, whereby the high speed measurement can be made.

The scatterometry has a merit in comparison with the SEM in measuring the above-mentioned cross-sectional profile of the circuit pattern. However, since preliminary computation of a large number of waveforms is necessary, it is required to carry out the optical simulation at a high speed. Due to this, a computation method called "Rigorous Coupled Wave Analysis" disclosed in, for example, "Diffraction Analysis of Dielectric Surface-relief Gratings", J. Opt. Soc. Am., Vol. 72, No. 10, 1982 is adopted. This is a method of seeking coefficients of series solution of a wave equation by: approximating a pattern section by a plurality of rectangular layers; remarking the respective rectangular layers as a diffraction grating with the same pitch and duty that continue endlessly; and matching boundaries thereof with each other. The above method carries out the waveform computation at the significantly high speed in comparison with a finite element method that is another solution of the wave equation.

A method of carrying out the focus control by relating the pattern cross-sectional shape and the focus deviation, which have been measured using such scatterometry is disclosed in, for example, "The Proceedings of the 64th Autumn Meeting of The Japan Society of Applied Physics", 1p-R-2, P 641 (2003).

Meanwhile, in the above scatterometry, when the focus margin in the exposure step to be applied is small and detection accuracy of defocus is required, sensitivity to a change of the cross-sectional shape with respect to focus change becomes important. However, in the method by the above simulation, an influence on computation errors of cross-sectional shape owing to error between dimensions of the simulation and a practical device has not be ignored.

Further, the patterns of the measurement object in the scatterometry are required to have lines and spaces of the same pitch and duty within a range of several tens μm that serves as an illumination area, so that they are not always within an area on the smallest focus margin in practice. Thereby, the problem is such that the focus detection on the product circuit patterns cannot be made.

SUMMARY OF THE INVENTION

The present invention solves such a problem and provides a technique capable of: making, with high accuracy, the defocus detection in the exposure step with respect to miniaturization of the semiconductor devices even when the focus margin is small; and realizing individually and easily optimization of exposure conditions such as exposure dose and focus of photolithography in the production process of the semiconductor device. Further, the present invention provides a technique capable of realizing individually and easily optimization of etching conditions such as pressure and temperature.

The above and other objects and features will be apparent from the description of this specification and the accompanying drawings.

Outlines of representative ones of the inventions disclosed in the present application will be described briefly as follows.

The present invention relates to a method for controlling a process of semiconductor devices and a method for producing semiconductor devices to which this method for controlling a process is applied, and it has the following features.

(1) The present invention includes a step of radiation light onto a pattern of a semiconductor wafer and using its scattered light to detecting information on a pattern shape, whereby variations of the production conditions from a change in the production conditions and a change in a scattered light waveform are detected and the production process is controlled.

(2) The production conditions are a combination of a focus condition and a exposure dose condition in an exposure step, a combination of a pressure condition and a temperature condition in an etching step, or a combination of both.

(4) The scattered light has a spectral waveform obtained by a spectroscope, an angle distribution waveform obtained by a change in reflected light with respect to an incident angle, or a combination of both.

(6) A method of detecting the change in the production conditions from the change in the scattered light waveform is: a method of subtracting a change amount owing to a film thickness variation in a step prior to an objective step or a method of detecting a waveform change in a wavelength area where no change owing to the film thickness variation occurs in the step prior to the objective step; a method of seeking a regression equation by a statistical processing of a waveform change amount and a production condition change amount; in order to determine only a pattern shape change in the step, a method of using a change in a ratio waveform between a TE polarization amount and a TM polarization amount of the scattered light waveform, a method of referring a scattered light waveform in an area without any pattern, or a method of retaining preliminary and referring underlying-film thickness data; or a method of making preliminarily a sample, whose production condition is varied by only a specified amount, and obtaining the scattered light waveform by using the sample, and the sample is made by exposure simulation.

The present invention includes, as specific functions, a means for obtaining an optical waveform of a developed arbitrary pattern that is a measurement object on the semiconductor wafer by a scatterometry, a means for detecting continuously the optical waveforms from the wafer preliminarily made by changing the exposure conditions, a means for extracting the characteristic points on the optical waveforms fluctuated by the change in the exposure conditions, a means for computing statistically the characteristic points and the change in the exposure conditions, an estimation means for estimating the exposure conditions using the computation results, and a means for reflecting the estimated result to a process state to stabilize the process.

The optical waveform by the scatterometry is the spectral waveform of the zero order reflected light of the measured pattern or the angle distribution waveform of the zero order reflected light. The means for extracting the characteristic points on the optical waveforms is carried out by taking into consideration not only the exposure conditions but also the variation of the optical waveforms owing to the underlying-film thickness variation in the previous step. The developed arbitrary pattern on the semiconductor wafer is used not only to make a sample wafer by varying focus and exposure dose of the exposure system in practice but also to estimate the pattern cross-sectional shape by exposure/development simulation.

Effects obtained from representative ones of the inventions disclosed in the present application will be briefly described as follows.

(1) Since the deviation from the optimal values of exposure dose and focus of the product circuit pattern can be determined is sought from the measurement data of the test patterns, it is possible to control the exposure dose and focus of the fine device having a small margin concurrently and individually and improve the yield.

(2) The product circuit pattern other than the line and space can become also the measurement object, so that when an area having the smallest margin is selected, the yield can be improved in comparison with the case of using the circuit patterns in other areas.

(3) In the scatterometry using the light radiation, the vacuuming requiring more time than the case of using the signal waveform having the SEM and the like is unnecessary, so that the throughput for obtaining the signal waveform can be improved. Further, in the case of the SEM, there is a possibility that the cross-sectional profile of the pattern to be measured is changed by the electron beam radiation. However, in the case of the light radiation, there is little risk of damage caused by such measurement.

(4) Pressure and temperature can be controlled concurrently and independently also in the etching step, so that the yield can be improved.

These and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
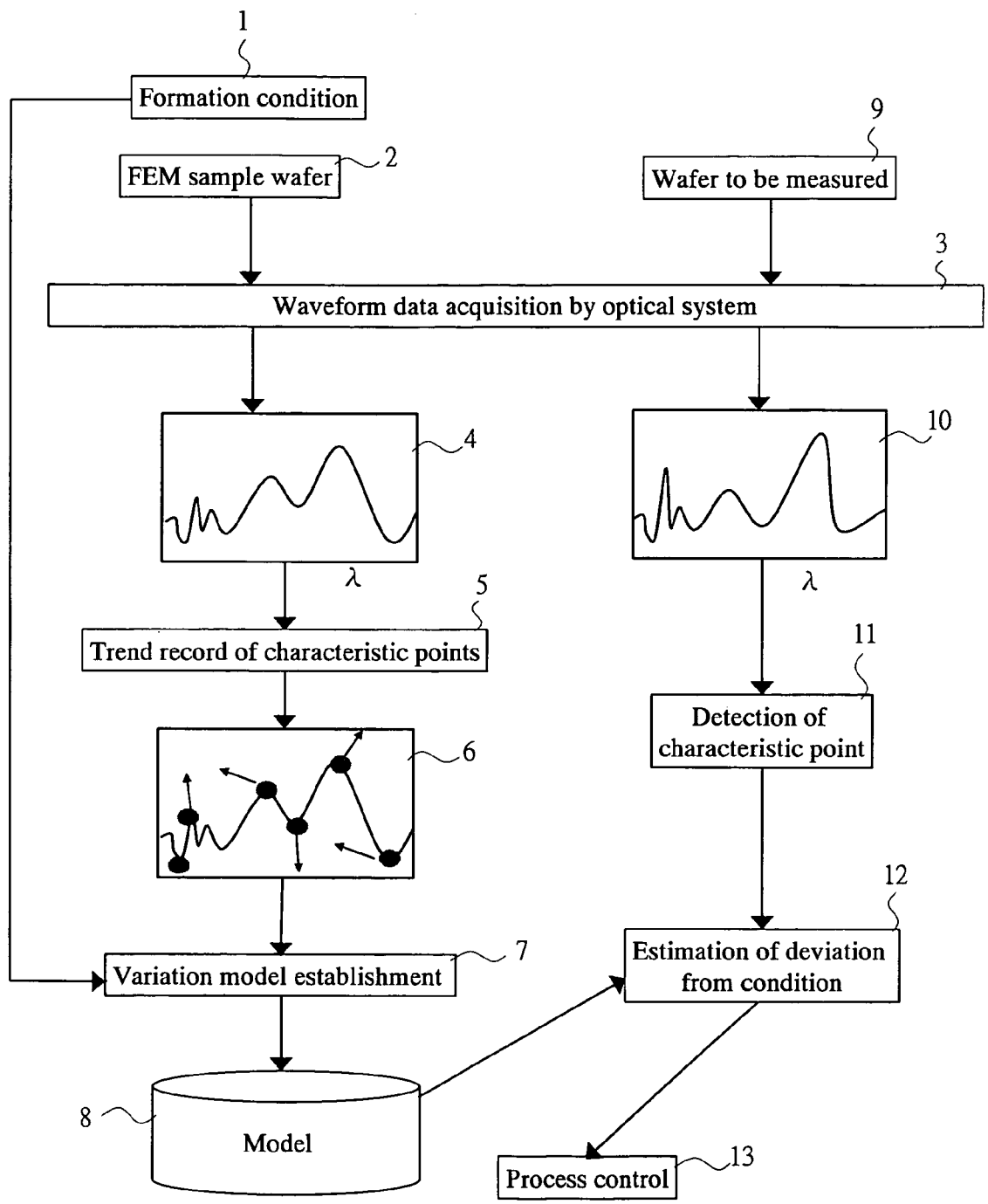
FIG. 1 is a flow chart showing an example of a measurement system in a method for producing semiconductor devices to which a process controlling method that is an embodiment of the present invention is applied.

Hereinafter, embodiments of the present invention will be detailed based on the drawings. Note that, throughout all the drawings for explaining the embodiments, the same members are denoted in principle by the same reference numerals and the repetitive description thereof will not be omitted.

FIG. 1 is a flow chart showing an example of a measurement system in a method for producing semiconductor devices applied to a process controlling method that is an embodiment of the present invention. In the present embodiment, an exposure step will be in particular explained as an example.

Figure 22:
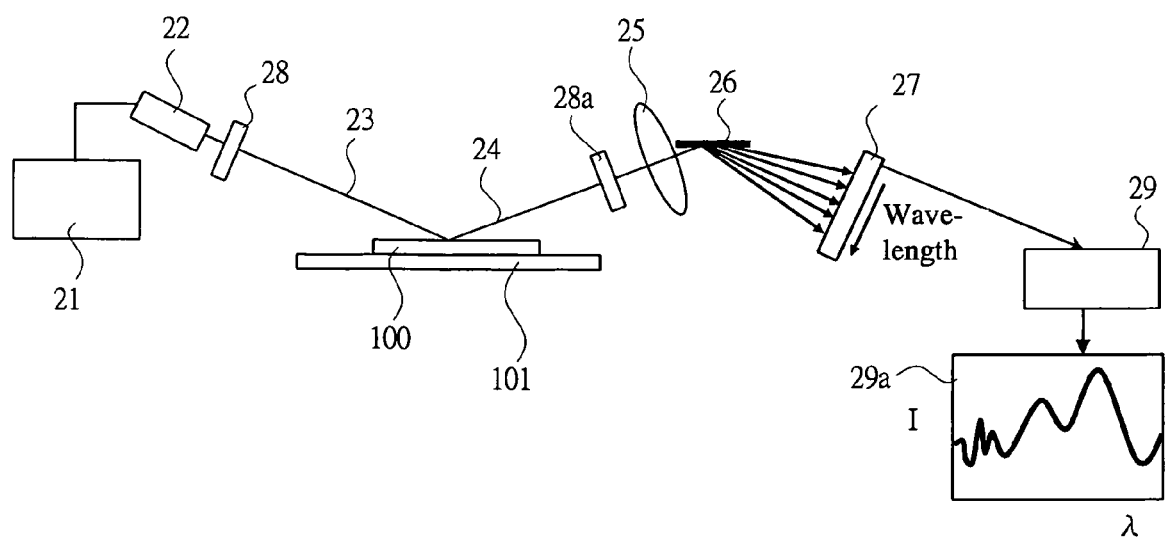
FIG. 22 is a view showing an example of a structure of a scatterometry pattern measuring system of spectral waveform system in the technique examined as the premise for the present invention.
Figure 23:
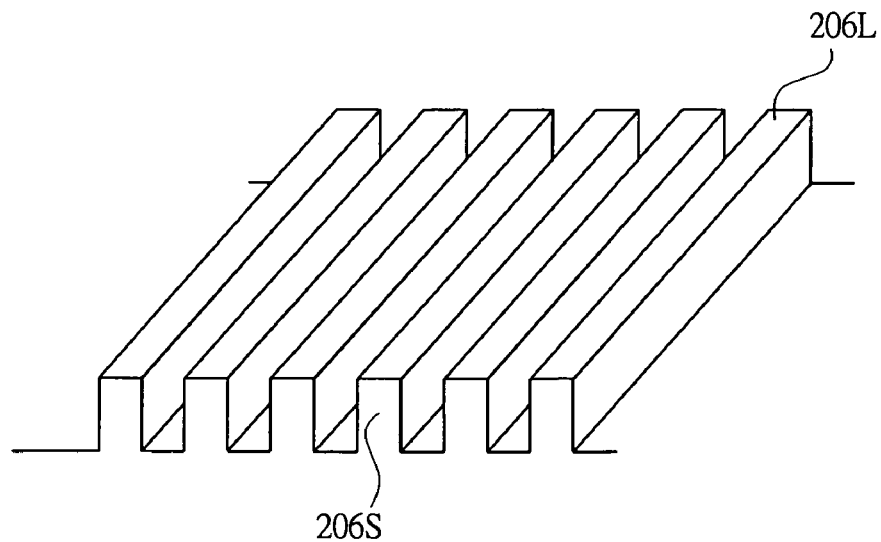
FIG. 23 is a view showing an example of a line and space pattern on a wafer in the technique examined as the premise for the present invention.
Figure 24:
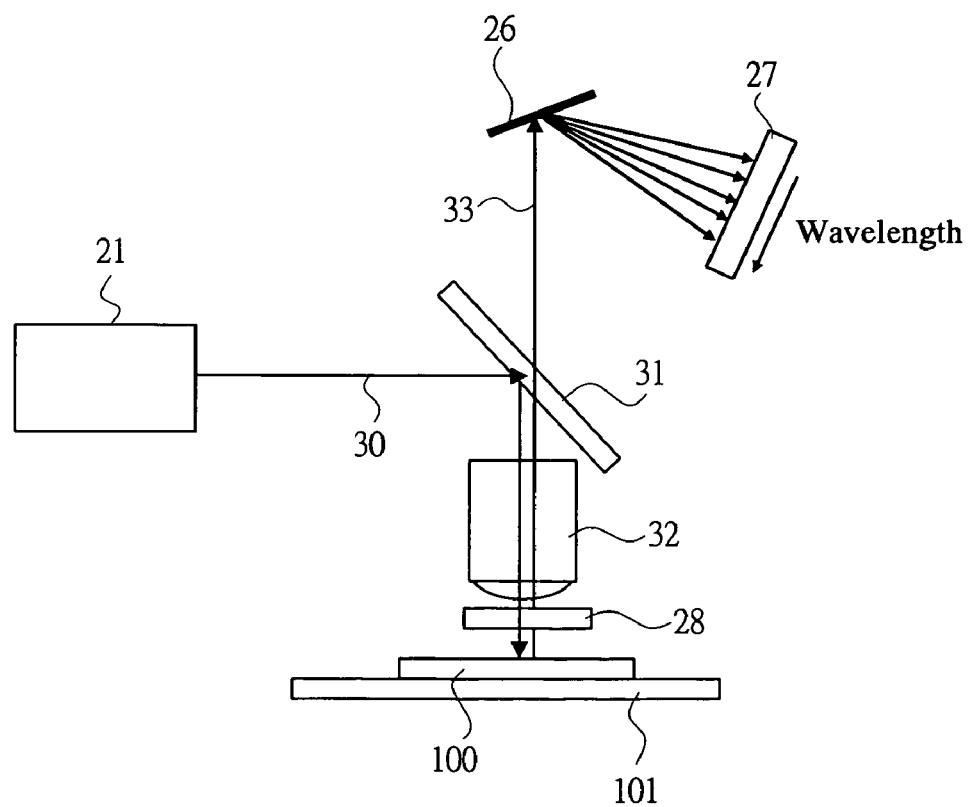
FIG. 24 is a view showing an example of a structure of the scatterometry pattern measuring system of spectral waveform system in the technique examined as the premise for the present invention.
Figure 25:
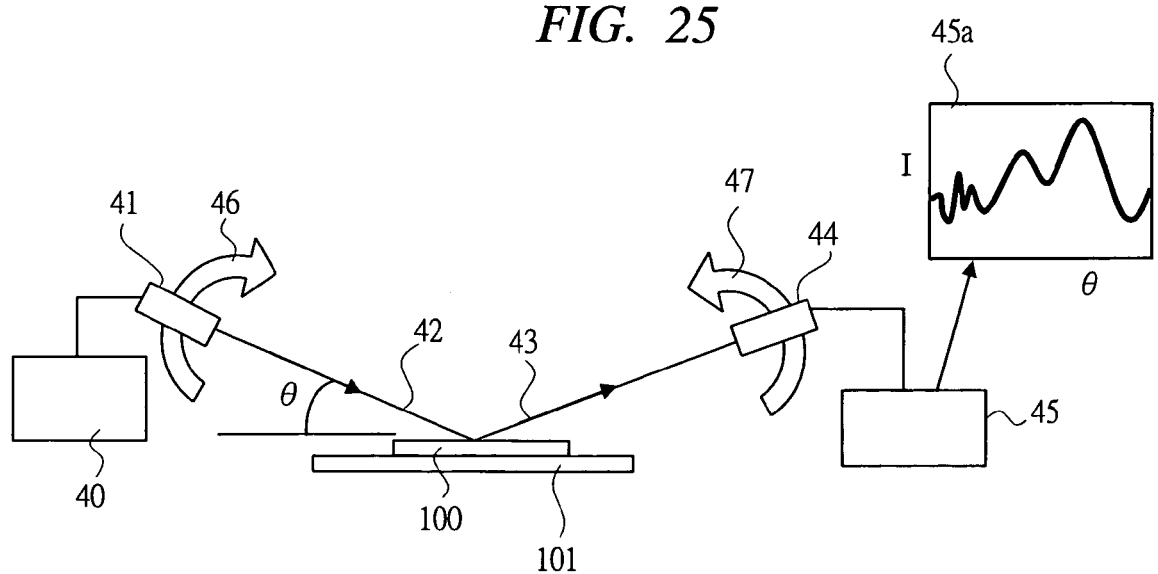
FIG. 25 is a view showing an example of a structure of a scatterometry pattern measuring system of angle-scanning type in the technique examined as the premise for the present invention.
Figure 26:
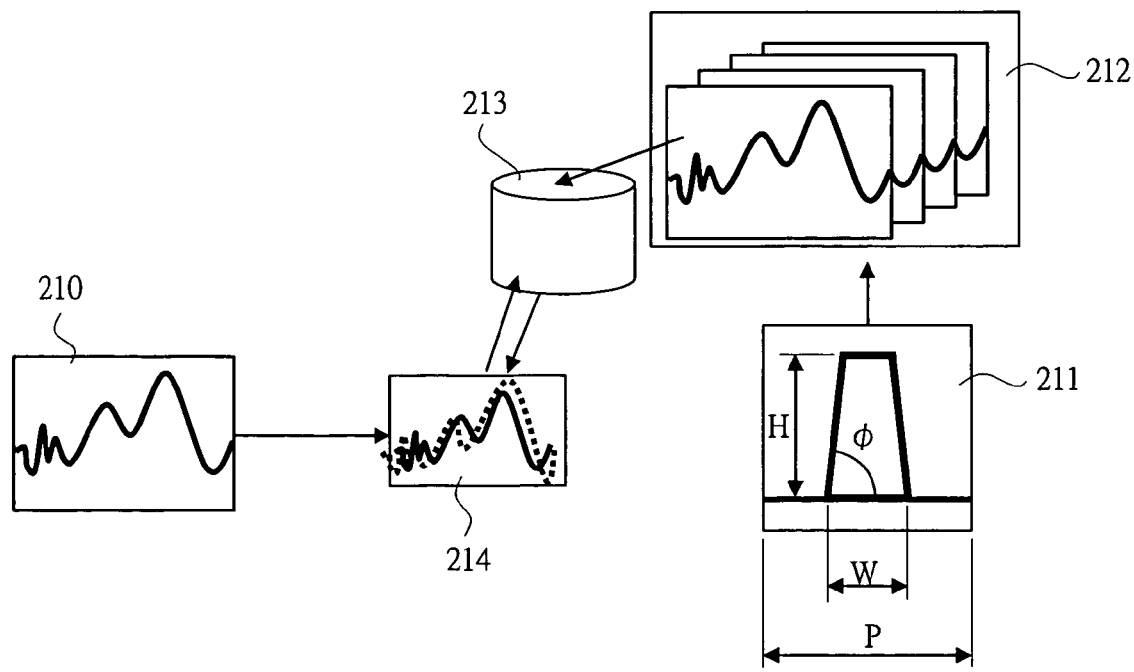
FIG. 26 is a view showing an example of a shape measurement method of a scatterometry pattern measuring system in the technique examined as the premise for the present invention.

A measurement system in a method for producing semiconductor devices according to the present embodiment is applied to the above-described techniques examined as a premise of the present invention and uses, for example, the scatterometry pattern measuring system of spectral waveform system shown in FIG. 22 or the scatterometry pattern measuring system of spectral waveform system shown in FIG. 24 to radiate light onto a pattern on a semiconductor wafer and detect shape information of the pattern by scattered light due to its reflection. Besides, the above-described scatterometry pattern measuring system of angle-scanning type shown in FIG. 25 or the like may be used.

First, in accordance with "formation conditions" of step 1, conditions under which focus and exposure dose of an exposure system are varied per specific amount are determined in a step of forming a resist pattern. These are determined by taking into consideration standard focus and/or exposure dose and a variation to be possibly varied.

Figure 2:
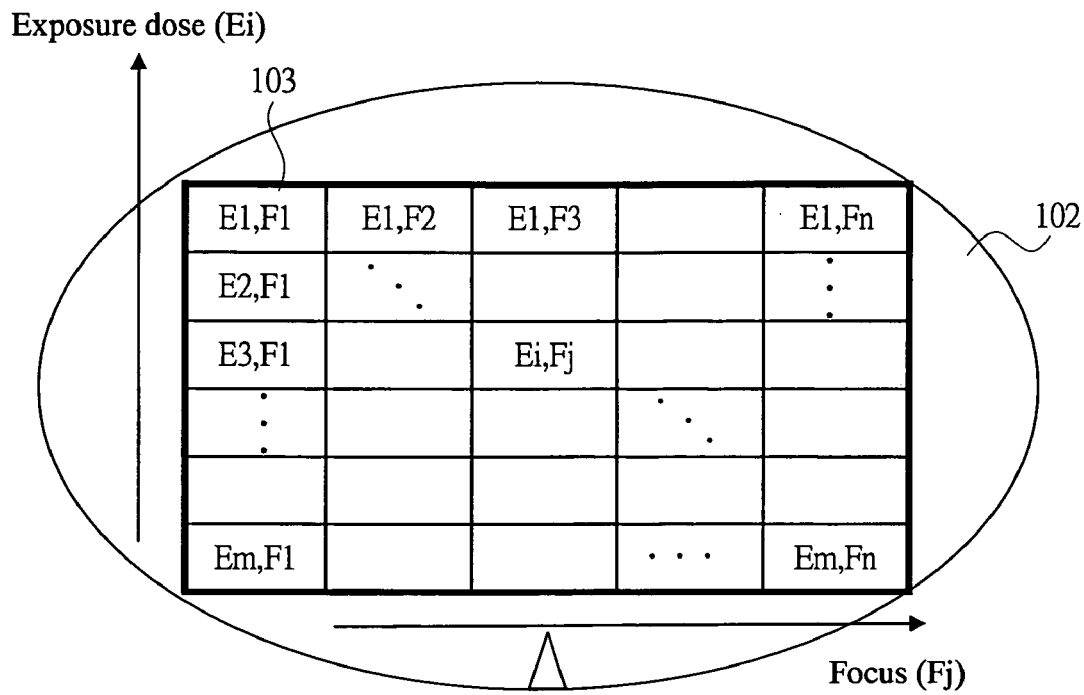
FIG. 2 is a view showing an example of a FEM sample wafer in the method for producing semiconductor devices according to the embodiment of the present invention.

Next, using a "focus exposure matrix (FEM) sample wafer" of step 2, the FEM sample wafers are made under the above conditions. In FIG. 2, an example of this FEM sample wafer (focus/exposure dose matrix) is explained in detail. A FEM sample wafer 102 is a wafer having been exposed by changing, per specific amount, each of focus F whose shots are in a transverse direction and exposure dose E whose shots are in a vertical direction. When the focus value is varied from F1 to Fn and the exposure dose is varied from E1 to Em, shots on the wafer surface are exposed as Ei, Fj (i=1 to n and j=1 to m). For example, the shots 103 in FIG. 2 are shots having been exposed under the condition of E1 and F1.

Figure 3:
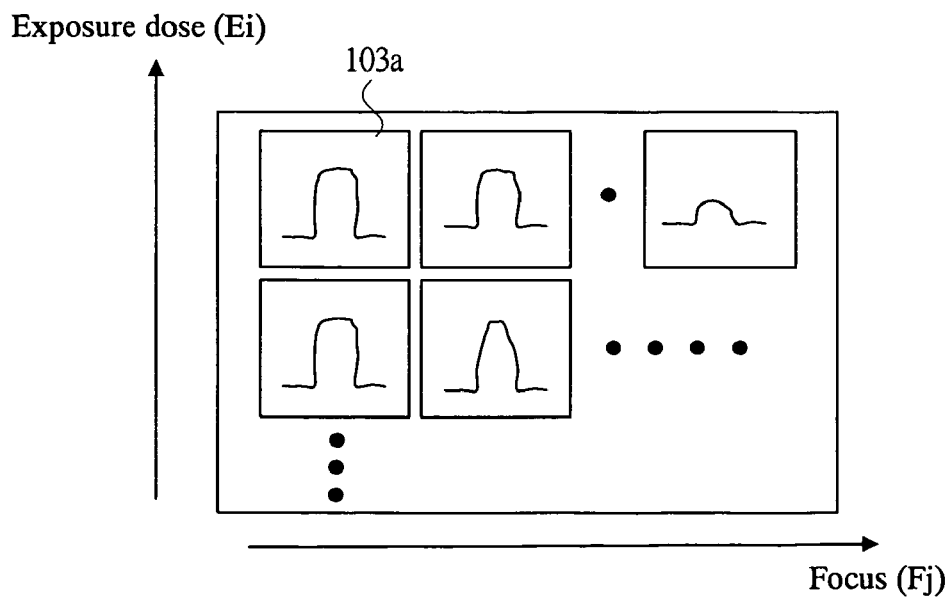
FIG. 3 is a view showing an example of a pattern cross-sectional shape of the FEM sample wafer in the method for producing semiconductor devices according to the embodiment of the present invention.
Figure 4:
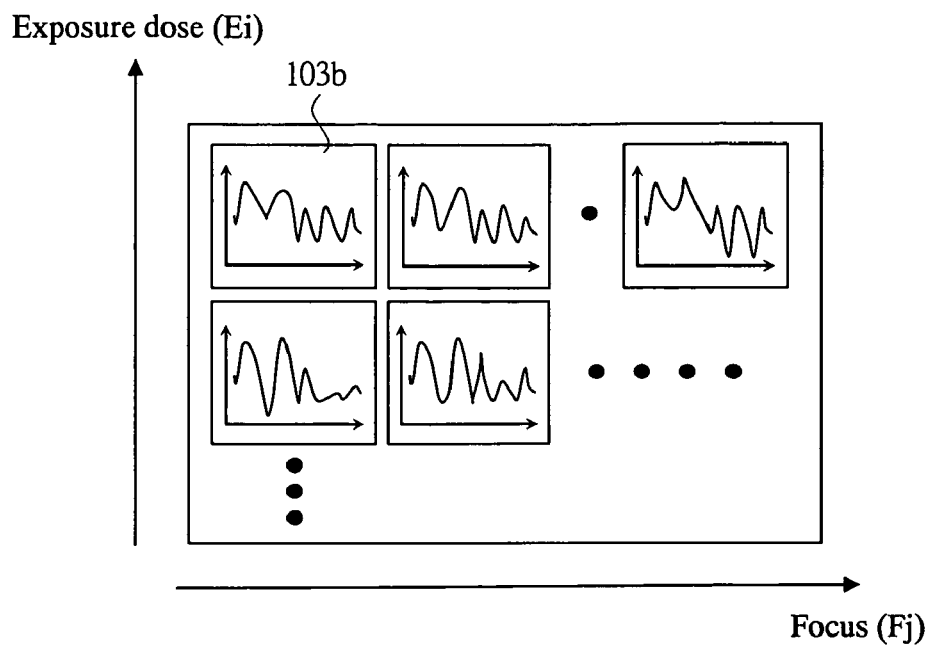
FIG. 4 is a view showing an example of waveform data of the FEM sample wafer in the method for producing semiconductor devices according to the embodiment of the present invention.

With respect to each shot on such an FEM sample wafer, waveforms are detected by "waveform data acquisition by optical system" of step 3. This example is explained using FIG. 3. FIG. 3 is a view showing one example (cross-sectional profile matrix) in which a pattern cross-sectional shape of the shot on the FEM sample wafer 102 made in FIG. 2 is illustrated for every corresponding shot. The cross-sectional shapes of the shots 103 are different from on another depending on each focus/exposure dose. For example, the cross-sectional shape of the shot 103 in FIG. 2 is denoted by the reference numeral "103a" in FIG. 3. Data on this waveform is obtained from all the shots on such an FEM sample wafer and, as a result (step 4), the waveform map shown in FIG. 4 is obtained. FIG. 4 represents one example (optical waveform matrix) of waveform data corresponding to that of FIG. 3 at each shot in FIG. 2 and, for example, the waveform data for the shot 103 is denoted by the reference numeral "103b".

Figure 5:
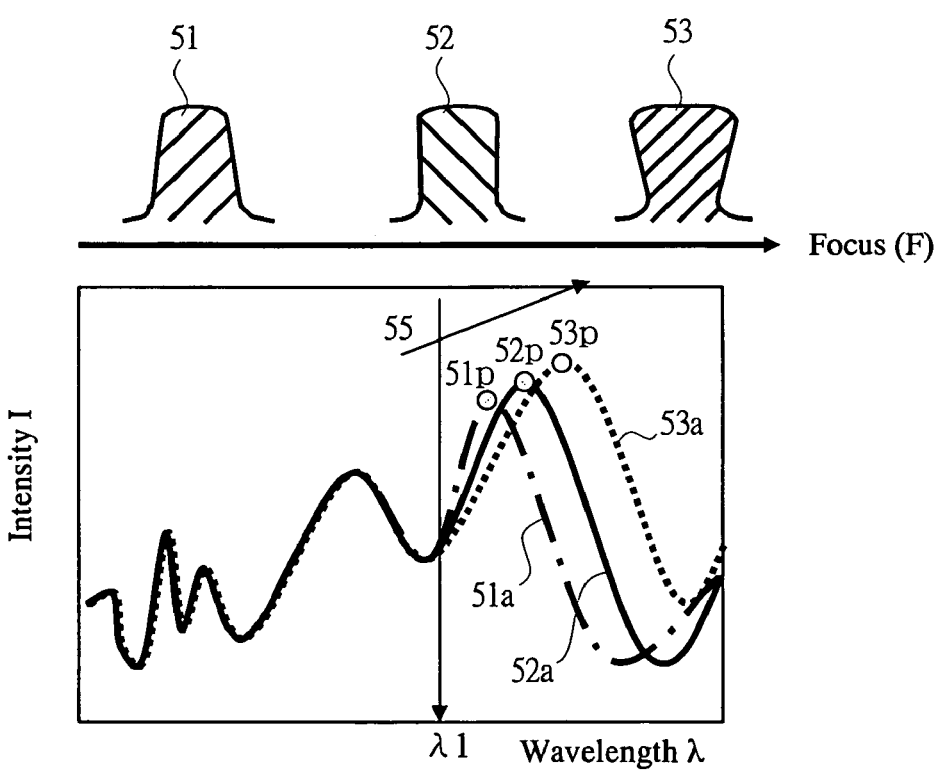
FIG. 5 is a graph showing an example of a variation of a cross-sectional shape and an example of a variation of optical waveform owing to a focus change in the method for producing semiconductor devices according to the embodiment of the present invention.

Next, in step 5, the trend record of the characteristic points is taken from the waveform data obtained by using the FEM sample wafer. This is explained in detail with reference to a graph illustrating examples of the cross-sectional shape change and the optical waveform change (wavelength-intensity) owing to a focus change in FIG. 5. The shapes of the pattern cross sections 51 to 53 differ from one another depending on the difference of focus F on the FEM sample wafer, and optical waveform data at the respective shots are denoted by the reference numerals "51a", "52a", and "53a", respectively. A change in the cross-sectional shape occurring due to the focus change causes a waveform change within an area with a wavelength $\lambda 1$ or longer. Here, when attention is paid, for example, to peaks $51p$, $52p$, or $53p$ within a change area of each waveform, it is found that the peaks shift in a direction indicating an arrow 55 owing to the focus changes. In this way, the trend is examined using inflection points on all the waveforms as characteristic point.

Figure 6:
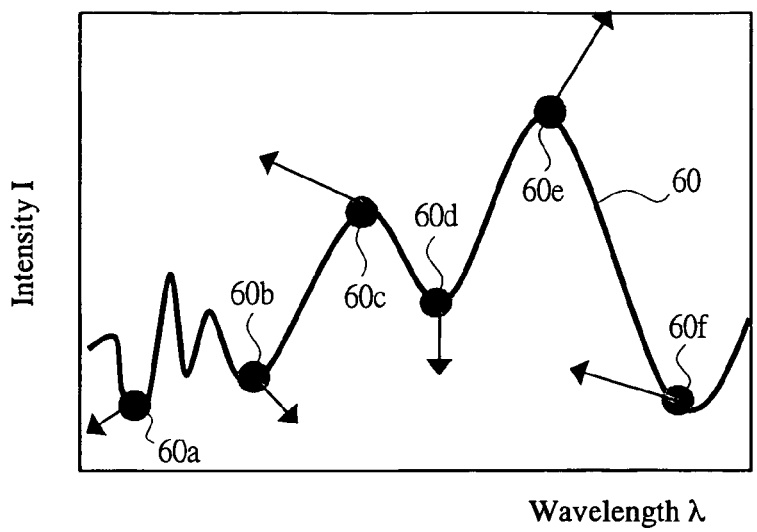
FIG. 6 is a graph showing an example of variation points on the optical waveform in the method for producing semiconductor devices according to the embodiment of the present invention.

Then, the characteristic points on all the waveforms are illustrated by step 6, and its variation model is established by step 7. This is explained in detail with reference to a graph of FIG. 6 showing one example of points changed on an optical waveform. The graph of FIG. 6 shows a waveform 60 detected on the FEM sample wafer and its characteristic points $60a$ to $60f$. When the number of characteristic points is set to N and change amounts at an i-th characteristic point are represented by $(\Delta\lambda i, \Delta Ii)$ on the wavelength—intensity coordinates, the change amount $\Delta F$ of focus F and the change amount $\Delta E$ of exposure dose E are represented as a summation of values obtained by multiplying the change amounts at all the characteristic points by coefficients, respectively, with using all the waveforms detected on the FEM sample wafer.

These ΔF and ΔE are shown in equation (1) as described below:

$$\Delta \dot{F} = \sum_{i=1}^{N} (\alpha i \cdot \Delta \lambda i + \beta i \cdot \Delta I i) \qquad \text{Equation (1)}$$

$$\Delta E = \sum_{i=1}^{N} (\gamma i \cdot \Delta \lambda i + \delta i \cdot \Delta I i).$$

Note that "N" is the number of characteristic points and "αi", "βi", "γi", and "δi" are coefficients. Here, the coefficients are values computed by statistical processing computation and are called a weighting factor. A coefficient becomes larger at a characteristic point with a larger change, and a coefficient becomes close to 0 (zero) at a characteristic point with little change.

Couples of such coefficients form a model equation for the variation model established in the step 7. Association with the model equation thus established and the formation conditions of the step 1 is set as a database of the model in step 8. Accordingly, by expressing the waveform change, and direct focus, exposure dose change through the model equation, displacement detection with high sensitivity and few errors can be made.

Further, for the production process for products in step 9, the wafer to be measured is taken out with necessary frequency, and the waveform data is obtained in the step 3. From the obtained waveform (step 10), the characteristic points are detected (step 11) similarly to the above steps, and the model having been already established is referred from the database model (step 8), whereby the change amount ΔF of the focus and the change amount ΔE of the exposure dose are computed. This result is notified of "process control" of step 13.

Figure 7:
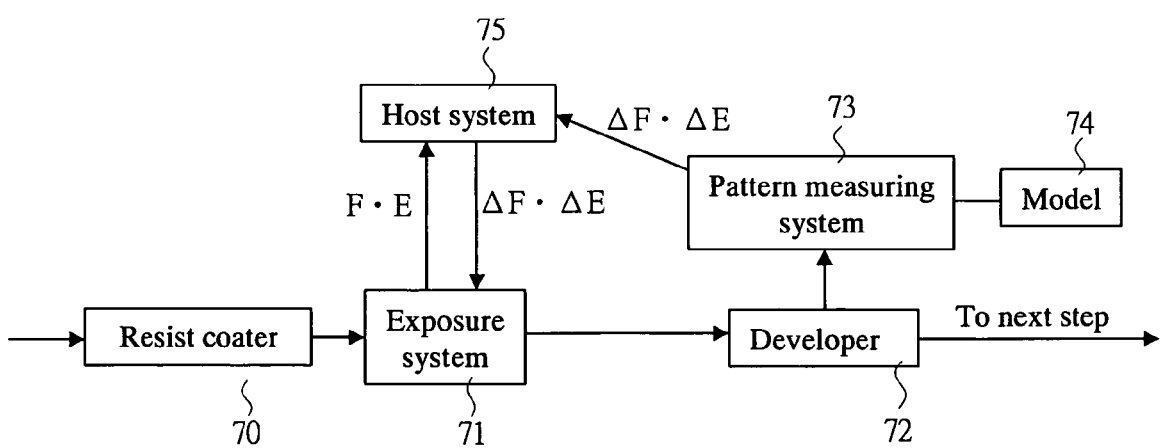
FIG. 7 is a view showing an example of a process controlling method that is applied to an exposure step of the semiconductor devices in the method for producing semiconductor devices according to the embodiment of the present invention.

One example of this process controlling method is explained with reference to FIG. 7. FIG. 7 represents an example in which the present measurement system is applied to the exposure step of the semiconductor device.

First, a resist is coated on a product wafer by a resist coater 70, and a desired pattern is exposed by an exposure system 71. At this time, since exposure is performed by the exposure system 71 under the exposure conditions (focus F and exposure dose E), information on them is transmitted to a host system 75 in advance. Next, the exposed product wafer is developed by a developer 72 to form a resist pattern. At this time, change amounts (focus ΔF and exposure dose ΔE) of the exposure conditions are measured using the model 74 established in advance by the pattern measuring system 73 according to the present invention, and is transmitted to the host system 75. If the change amounts of the exposure conditions are within the specified values, the product wafer advances to the next step. Meanwhile, the change amounts measured are processed by the host system 75 and fed back to the exposure system 71 according to need, thereby being updated to such exposure conditions as to make an appropriate pattern always formed.

For the measurement pattern in the foregoing, the line and space is presumed. However, in the measurement, it is not required to carry out such pattern cross-sectional measurement as to be carried out by the conventional scatterometry. Therefore, the measurement object is not limited to the periodic pattern such as the line and space, and can be a complex and aperiodic pattern such as a product pattern.

Figure 8:
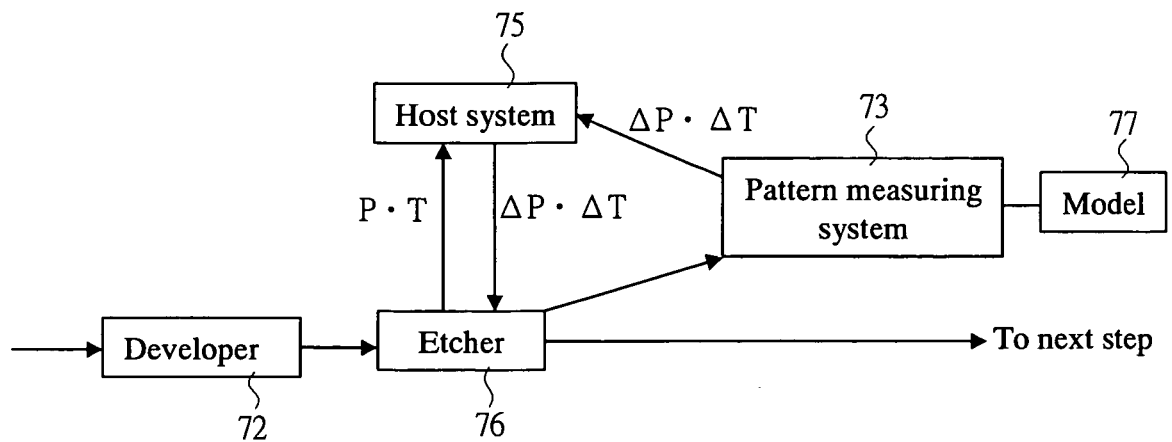
FIG. 8 is a diagram to show an example of the process controlling method that is applied to an etching step of the semiconductor device in the method for producing semiconductor devices according to the embodiment of the present invention.

Note that, in an example of the above-described process controlling method, the exposure step is explained as an example. However, the method can be applied to the etching step as shown in FIG. 8. A wafer with the resist pattern formed by the developer 72 is etched by an etcher 76 and is measured by the pattern measuring system 73. At this time, pattern variations owing to the change amounts ΔP and ΔT of etching pressure P and temperature T are registered in a model 77 in advance similarly to the exposure step described in the above example, so that the change amounts are fed back to the etcher 76 similarly to the above example and the etching conditions are updated to make an appropriate pattern always formed.

Sequentially, one example of another method for the trend record of the characteristic points in the above step 5 in FIG. 1 is explained with reference to each of FIGS. 9 to 11, FIGS. 12 to 14, and FIGS. 15 and 16.

Figure 9:
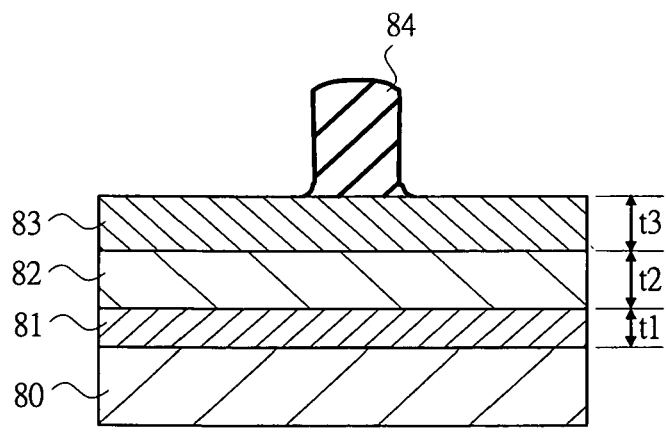
FIG. 9 is a view showing an example of a cross section of a resist having an underlying film formed in a previous step in the method for producing semiconductor devices according to the embodiment of the present invention.
Figure 10:
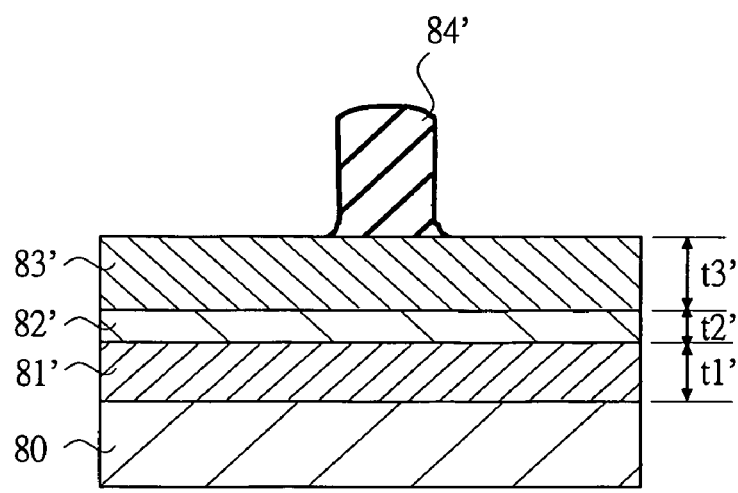
FIG. 10 is a view showing an example of a cross section of the resist of a lot different from that in FIG. 9 in the method for producing semiconductor devices according to the embodiment of the present invention.
Figure 11:
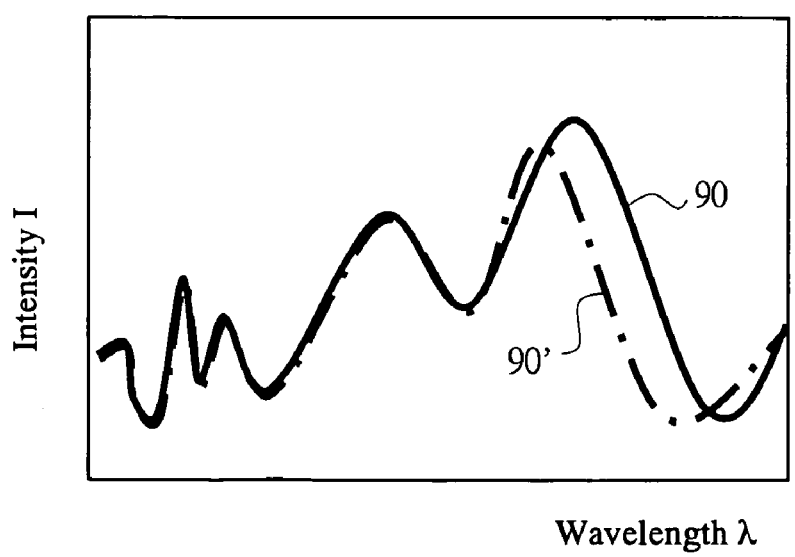
FIG. 11 is a view showing an example of optical waveform of a portion, which has the underlying film and in which the resist is formed at the different lot, in the method for producing semiconductor devices according to the embodiment of the present invention.

In FIGS. 9 to 11, FIG. 9 represents a pattern cross section of a measurement object. A multiple layer of underlying films 81 to 83 is formed on and over a silicon wafer 80 by the previous step, and a resist pattern 84 is exposed and developed thereon. Respective film thicknesses are denoted by the reference numerals t1 to t3. The spectral waveform taken by the above detected optical system at this time is a waveform 90 in FIG. 11. Meanwhile, a pattern cross section of a different lot in the same step as that in FIG. 9 is shown in FIG. 10. Since the same step is used, a structure of underlying films 81' to 83' on the silicon wafer 80 is the same. However, their thicknesses t1' to t3' are slightly different from those of the underlying films in FIG. 9 because of a variation of process. The spectral waveform of the pattern in FIG. 10 measured by the above detected optical system is a waveform 90' in FIG. 11 and is slightly different from the waveform 90. When the film thicknesses of the lower layers are changed owing to the process variation like this, it is impossible to judge whether the wave variation is caused by the difference between the resist pattern 84 and the resist pattern 84'. Therefore, an influence on underlying film variation can be reduced by comparing, for example, the waveform variation in FIG. 5 and capturing a wavelength change within a wavelength range in which a change of only the resist shape of the uppermost portion appears, for example, within only a short wavelength range of a waveform of 300 nm or shorter.

Figure 12:
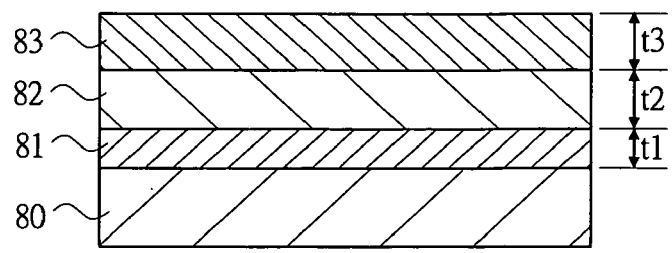
FIG. 12 is a view showing an example of a cross section of an area having no resist of the wafer in FIG. 9 in the method for producing semiconductor devices according to the embodiment of the present invention.
Figure 13:
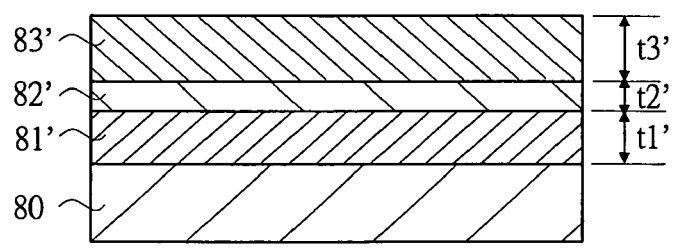
FIG. 13 is a view showing an example of a cross section of an area having no resist of the wafer in FIG. 10 in the method for producing semiconductor devices according to the embodiment of the present invention.
Figure 14:
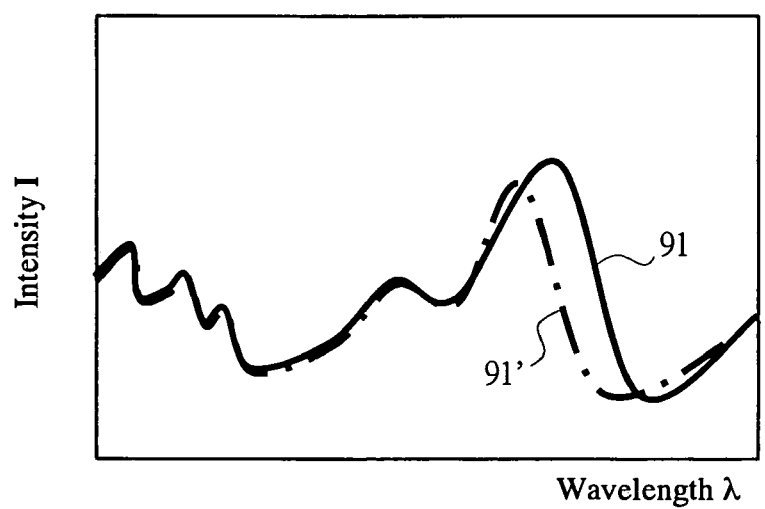
FIG. 14 is a view showing an example of a waveform of a portion, which has the underlying film and in which no resist is formed at the different lot, in the method for producing semiconductor devices according to the embodiment of the present invention.

In FIGS. 12 to 14, the case where the underlying film variation caused by the previous step exists as described above is examined. FIG. 12 represents an area where no resist is formed at the same shot as that with the measurement-object pattern in FIG. 9; and FIG. 13 represents an area where no resist is formed at the same shot as that with the measurement-object pattern in FIG. 10. The thickness of each underlying film can be approximately regarded as the same if being within the same shot. Spectral waveforms captured by the above-mentioned optical system within areas of FIGS. 12 and 13 become waveforms 91 and 91' of FIG. 14, respectively. Here, for example, by comparing a change of the waveform 90 to the waveform 91 with a change of the waveform 90' to the waveform 91', only the change in the resist shape of the uppermost portion is captured, whereby the influence on the underlying film variation can be reduced.

Figure 15:
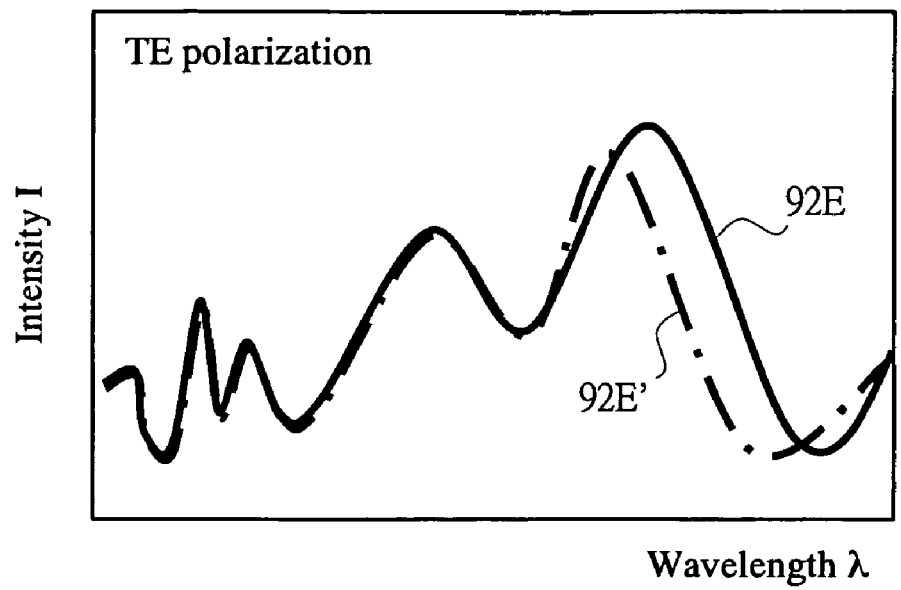
FIG. 15 is a view showing an example of optical waveforms by TE modes of the resists shown in FIGS. 9 and 10 in the method for producing semiconductor devices according to the embodiment of the present invention.
Figure 16:
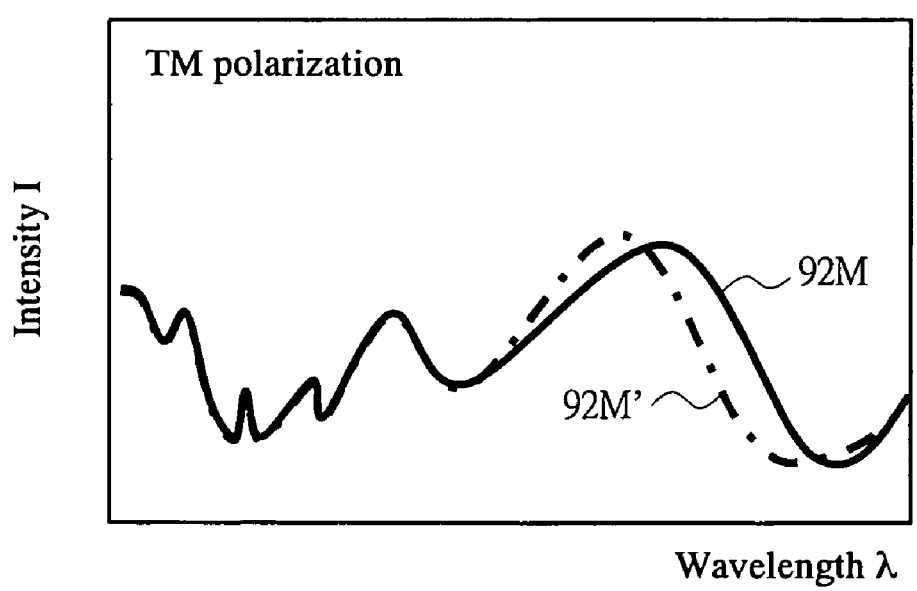
FIG. 16 is a view showing an example of the optical waveforms by the TE modes of the resists shown in FIGS. 9 and 10 in the method for producing semiconductor devices according to the embodiment of the present invention.

In FIGS. 15 and 16, FIG. 15 represents a spectral waveform having been detected by using TE polarization in the above optical system, wherein a waveform 92E is a waveform with the measurement object pattern in FIG. 9 and a waveform 92E' is a waveform having the measurement object pattern in FIG. 10. Similarly, FIG. 16 represents a spectral waveform having been detected by using the TM polarization in the above optical system, wherein a waveform 92M is a waveform with the measurement object pattern in FIG. 9 and a waveform 92M' is a waveform with the measurement object pattern in FIG. 10. Here, the underlying films 81 to 83 and 81' to 83' have no relation to polarization directions, so that both the TE polarized waveform and the TM polarized waveform owing to the change in the underlying film cause the same changes. Meanwhile, since the resist patterns 84 and 84' are formed in parallel or orthogonally to the polarization direction, different changes occur in the TE polarized waveform and the TM polarized waveform owing to the shape changes. Therefore, by comparing the waveform 92M of the TM polarization with respect to the waveform 92 of the TE polarization (for example, a computation result such as 92E/92M) and the waveform 92M' of the TM' polarization with respect to the waveform 92E' of the TE polarization, the change in only the resist shape of the uppermost portion is captured, so that the influence on the underlying film variation can be reduced.

Subsequently, an application example to a production line of semiconductor devices that is one embodiment of the present invention is explained using FIGS. 17 to 19.

Figure 17:
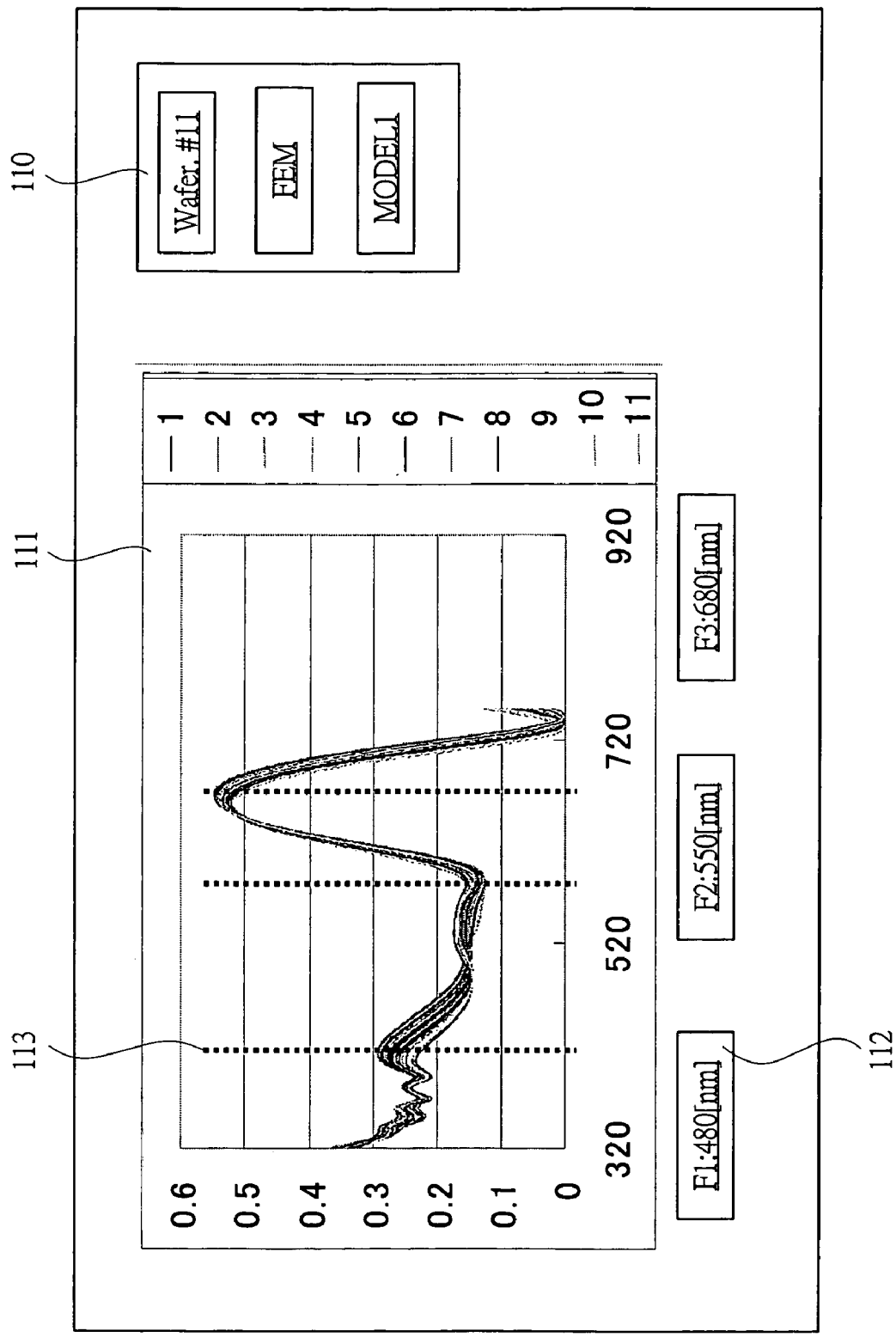
FIG. 17 is a view showing an example of a setting screen representing a trend record of characteristic points of the optical waveform in the method for producing semiconductor devices according to the embodiment of the present invention.

FIG. 17 represents one example of a setting screen of the trend record of the characteristic points in the step 5 in the above FIG. 1. Information on the measurement-object wafer (for example, wafer No., kind of production, model No.) is displayed in a wafer information area 110 on the screen, and all spectral waveforms on the measurement-object wafer are displayed in a graph display area 110. By such display, a wavelength area with large changes and characteristic points can be manifested. Owing to this, a user can select, for example, a specified wavelength 113 from the graph and easily designate its wavelength value 112 to the characteristic point.

Figure 18:
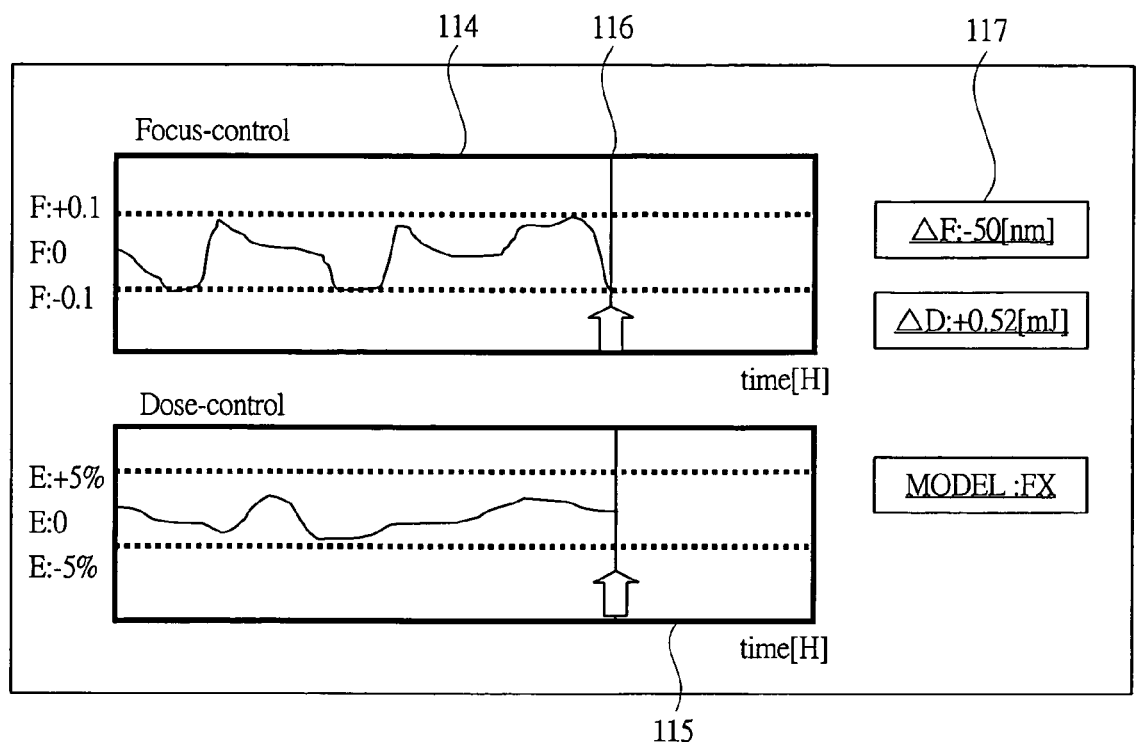
FIG. 18 is a view showing an example of a screen for monitoring an exposure state of a measured product wafer in the method for producing semiconductor devices according to the embodiment of the present invention.

FIG. 18 represents one example of a screen for monitoring a exposure state (deviations of focus and exposure dose) of a measured product wafer. The screen includes a graph 114 showing a time change in focus deviations and a graph 115 showing a time change in exposure dose deviations, wherein a numerical value of a deviation state 116 at a current time is shown in an area 117. By showing an upper limit value and a lower limit value on each of the graphs 114 and 115 by broken lines or the like, it becomes possible to judge easily the exposure states of the products. The display on each graph is not limited to a time unit and may be made at, for example, a wafer unit, lot unit, or product unit, and may be determined depending on the current production state.

Figure 19:
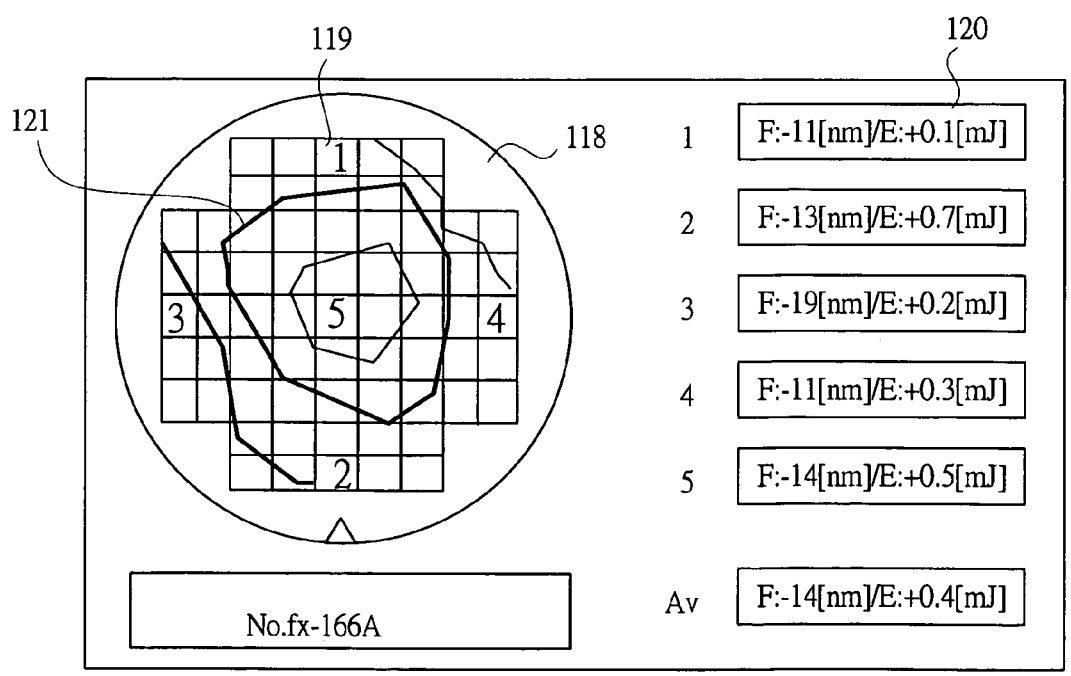
FIG. 19 is a view showing an example of a display of an exposure state distribution per wafer in the method for producing semiconductor devices according to the embodiment of the present invention.

FIG. 19 represents one example of a distribution display of an exposure state per wafer. Numerical values of a focus deviation and a exposure dose deviation at a measuring point 119 (1 to 5 in this example) on a measured wafer 118 are shown in an area 120. Further, since the distribution of the numerical values by contour lines 121 is shown as a distribution on the wafer surface, the exposure state of the wafer can be grasped easily.

Figure 20:
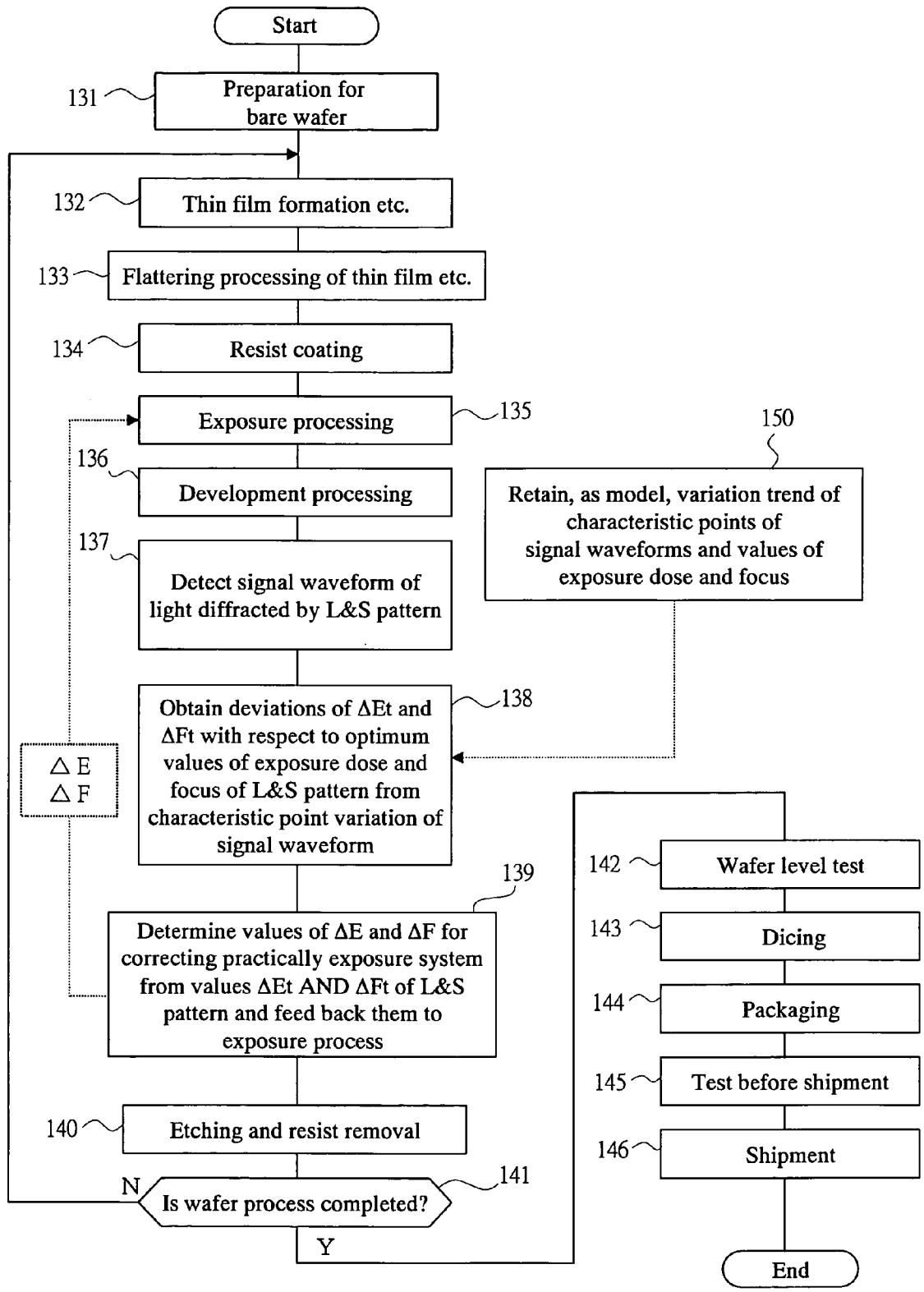
FIG. 20 is a flow chart showing an example of the method for producing semiconductor devices according to the embodiment of the present invention.
Figure 21:
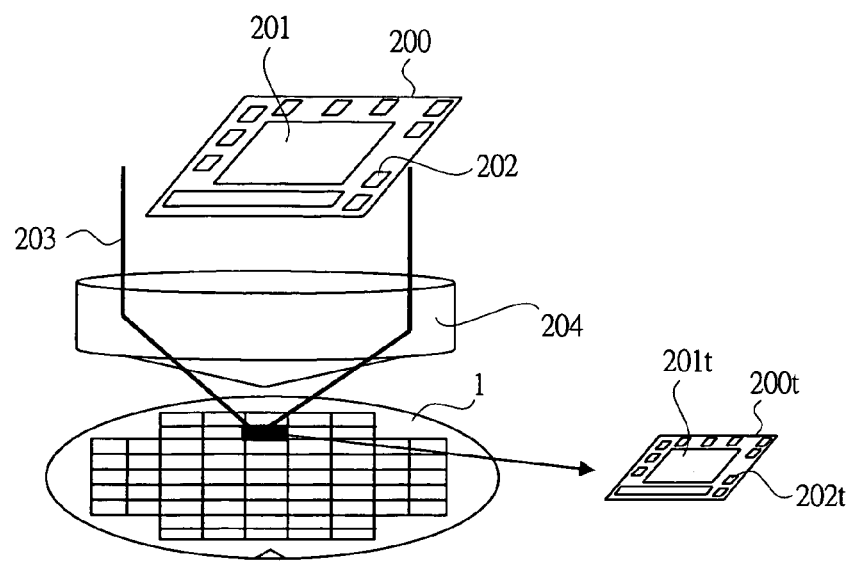
FIG. 21 is a view showing an example of an exposure step of semiconductor devices in a technique examined as a premise for the present invention.

Subsequently, one example of a method for producing semiconductor devices that is one embodiment of the present invention is explained using the flow chart in FIG. 20.

A wafer is prepared through steps of slicing, grinding, and the like an ingot of semiconductor mono crystal (step 131), and concurrently a variation trend of characteristic points of signal waveforms and values of exposure dose/focus for layers applied to the present invention (a layer with a small process margin, a layer having a low process allowance with respect to design, for example, a gate step and the like) are retained as a model in advance (step 150).

After a thin film or the like is formed on this wafer (step 132), a flattening processing thereto is performed (step 133), then a resist is coated (step 134), an exposure processing is carried out by the exposure system (step 135), and a development processing thereto is performed (step 136).

Here, in the present embodiment, a signal waveform of light diffracted by a line and space (L&S) pattern is detected (step 137), the detection result and the model stored in the step 150 are checked to obtain deviations $\Delta Et$ and $\Delta Ft$ with respect to the optimal values of exposure dose and focus of the L&S pattern from the characteristic point variations of the signal waveforms (step 138).

Further, values $\Delta E$ and $\Delta F$ for correcting practically the exposure system are determined from the values of $\Delta Et$ and $\Delta Ft$ of the L&S pattern obtained in the step 138, and are fed back to the exposure step in the step 135 to be reflected in the subsequent exposure step (step 139). Here, when the feedback amounts $\Delta E$ and $\Delta F$ are sought from the deviations $\Delta Et$ and $\Delta Ft$ obtained in the step 138, a statistical computation means is used and, for example, deviation data within the last one month is referred to and the feedback amounts are determined after predicting a deviation occurrence trend. Furthermore, setting of not being fed back is also possible according to deviations within the designed values or to designation by the user.

Thereafter, the product pattern is formed by etching using a resist as a mask, and the resist is removed (step 140). It is determined whether the wafer process is completed (step 141). If the wafer process is not completed, the process from the step 132 is repeated.

If the wafer process is completed, a functional test for each semiconductor device at a wafer level is conducted by a wafer probe or the like to select good products (step 142). Thereafter, the semiconductor devices are individually separated by dicing of the wafer (step 143). Packaging such as sealing is carried out only for the good products of the semiconductor devices (step 144). Further, tests such as burn-in tests are conducted before shipment (step 145). After the test, the good semiconductor devices are shipped as products (step 146).

As described above, according to the present embodiment, by the optical system in which light is radiated onto the pattern of the semiconductor wafer and scattered light by reflection is used to detect the information on the shapes of the patterns, the waveforms of the FEM sample wafer having a plurality of deformed patterns having been preliminarily made are detected and stored. One or more characteristic points on the spectral waveform that is generated in association with the pattern deformation are recorded, a variation model of the characteristic points is sought, and the spectral waveform is detected about a pattern to be measured in the same manner as that as described above. The variation model is used to estimate deviations (exposure dose deviation and focus deviation) in the formation conditions from the displacement of the characteristic points on the waveform, so that it is possible to feed back the exposure dose and focus individually and realize the process control with high accuracy.

Further, from the measurement data of the test patterns, a deviation from the optimal values of the exposure dose and focus of the product's circuit pattern can be determined, so that the exposure dose and focus for a fine device having a small margin can be individually and simultaneously controlled and the yield can be improved.

Furthermore, a product's circuit pattern other than the line and space pattern can be a measurement object, so that if an area with the smallest margin is selected, the yield can be improved in comparison with the case of using the circuit patterns in other areas.

Further, as to the scatterometry using the light radiation, the vacuuming requiring more time than the case of using the signal waveform such as a SEM is unnecessary, whereby a throughput for obtaining the signal waveform is improved. Still further, in the case of using the SEM, there is a possibility that the cross-sectional profile of the pattern to be measured will be changed by electron beam radiation. However, in the case of using the light radiation, there is little risk of damage caused by such a measurement.

As a result, also in miniaturizing the semiconductor devices, it is possible to make the defocus detection with excellent accuracy in the exposure step even when the focus margin is small and to realize the optimization of the exposure conditions such as exposure light and focus individually and easily in photolithography in the production process of the semiconductor devices.

Further, since lens aberration changes by a change in barometric pressure at a time of the exposure by the exposure system and the focus error occurs, the focus correction is carried out in some cases by a barometric pressure sensor in the device. However, according to the present invention, since the deviations of exposure and focus during manufacture of the products can be grasped, more frequent process control becomes possible.

Furthermore, also in the etching step, the variation model of the characteristic points is sought in advance, the spectral waveform of the pattern to be measured is detected, and the variation model is used to estimate the deviations (pressure deviation and temperature deviation) in the formation conditions from the displacement of the characteristic points. Therefore, the pressure and temperature can be independently fed back, and the process control can be realized with high accuracy.

In the foregoing, the invention made by the present inventors has been described based on the embodiments. However, needless to say, the present invention is not limited to the embodiments and can be variously modified within the scope of not departing from the gist thereof.

The present invention relates to a production technique for semiconductor device and is particularly effectively applied to methods of effecting exposure dose and focus control in an exposure step and further effecting pressure and temperature control in an etching step with high accuracy.

The invention may be embodied in other specific forms without departing from the spirit or essential characteristics thereof. The present embodiment is therefore to be considered in all respects as illustrative and not restrictive, and the scope of the invention being indicated by the appended claims rather than by the foregoing description and all changes which come within the meaning and range of equivalency of the claims are therefore intended to be embraced therein.

What is claimed is:

1. A method for controlling a process of producing semiconductor devices, comprising the steps of:
    irradiating light onto a wafer on which a pattern is formed and detecting scattered light from said wafer during the process of producing the semiconductor devices;
    obtaining shape information on said pattern by processing a signal of the detected scattered light;
    seeking a change in production conditions corresponding to said obtained shape information on the pattern by referring a relationship between a change in a production condition and a change in a scattered light waveform stored in a memory in advance; and
    using information on said sought change of the production conditions to control the production process of the semiconductor devices,
    wherein in the step of obtaining, said signal of the detected scattered light is a spectral waveform obtained by a spectroscope or an angle distribution waveform obtained by a change in reflected light with respect to an incident angle.

2. The method for controlling a process of semiconductor devices according to claim 1,
    wherein said production conditions are a combination of a focus condition and an exposure dose condition in an exposure step or a combination of a pressure condition and a temperature condition in an etching step.

3. The method for controlling a process of semiconductor devices according to claim 1,
    wherein a method of detecting the changes in the production conditions from said change in the scattered light waveform is a method of making preliminarily a sample, whose production condition is varied by only a specified amount, and obtaining the scattered light waveform by using said sample, and
    said sample is made by exposure simulation.

4. A method for controlling a process of producing semiconductor devices, comprising the steps of:
    irradiating light onto a wafer on which a pattern is formed and detecting scattered light from said wafer during the process of producing the semiconductor devices;
    obtaining shape information on said pattern by processing a signal of the detected scattered light;
    seeking a change in production conditions corresponding to said obtained shape information on the pattern by referring a relationship between a change in a production condition and a change in a scattered light waveform stored in a memory in advance; and
    using information on said sought change of the production conditions to control the production process of the semiconductor devices,
    wherein in the step of seeking, said change in production conditions is sought by monitoring a change of a point on the scattered light waveform where a level of said waveform changes larger than other part of the waveform with respect to the change of the production conditions.

5. The method for controlling a process of semiconductor devices according to claim 4,
    wherein a method of detecting the changes in the production conditions from said change in the scattered light waveform is a method of seeking a regression equation by a statistical processing of a waveform change amount and a production condition change amount.

6. The method for controlling a process of semiconductor devices according to claim 4,
    wherein said production conditions are a combination of a focus condition and an exposure dose condition in an exposure step or a combination of a pressure condition and a temperature condition in an etching step.

7. The method for controlling a process of semiconductor devices according to claim 4,
    wherein a method of detecting the changes in the production conditions from said change in the scattered light waveform is a method of making preliminarily a sample, whose production condition is varied by only a specified amount, and obtaining the scattered light waveform by using said sample, and said sample is made by exposure simulation.

8. A method for controlling a process of producing semiconductor devices, comprising the steps of:

irradiating light onto a wafer on which a pattern is formed and detecting scattered light from said wafer during the process of producing the semiconductor devices;

obtaining shape information on said pattern by processing a signal of the detected scattered light;

seeking a change in production conditions corresponding to said obtained shape information on the pattern by referring a relationship between a change in a production condition and a change in a scattered light waveform stored in a memory in advance; and using information on said sought change of the production conditions to control the production process of the semiconductor devices, wherein in the step of seeking, said change in production conditions is sought by subtracting a change amount owing to a film thickness variation in a step prior to an objective step or detecting a waveform change in a wavelength area where no change owing to the film thickness variation occurs in the step prior to the objective step.

9. The method for controlling a process of semiconductor devices according to claim 8, wherein a method of detecting the changes in the production conditions from said change in the scattered light waveform is, in order to determine only a pattern shape change in said step, a method of using a change in a ratio waveform between a TE polarization amount and a TM polarization amount of the scattered light waveform, a method of referring a scattered light waveform in an area without any pattern, or a method of retaining preliminary and referring underlying-film thickness data.

10. A method for producing semiconductor devices, comprising the steps of:

preparing a semiconductor wafer;

forming a circuit pattern for semiconductor device over said semiconductor wafer by lithography;

separating said semiconductor wafer into individual semiconductor devices; and sealing said individual semiconductor devices, wherein said step by lithography is performed by an application of the method for controlling a process of semiconductor devices according to claim 8.

11. The method for producing semiconductor devices according to claim 10, wherein said step by lithography includes an exposure step having focus and exposure dose conditions as production conditions or an etching step having pressure and temperature conditions as production conditions.

12. The method for controlling a process of semiconductor devices according to claim 8, wherein said production conditions are a combination of a focus condition and an exposure dose condition in an exposure step or a combination of a pressure condition and a temperature condition in an etching step.

13. The method for controlling a process of semiconductor devices according to claim 8, wherein a method of detecting the changes in the production conditions from said change in the scattered light waveform is a method of seeking a regression equation by a statistical processing of a waveform change amount and a production condition change amount.

14. The method for controlling a process of semiconductor devices according to claim 8, wherein a method of detecting the changes in the production conditions from said change in the scattered light waveform is a method of making preliminarily a sample, whose production condition is varied by only a specified amount, and obtaining the scattered light waveform by using said sample, and said sample is made by exposure simulation.

* * * * *